(12) United States Patent
Tsukada

(10) Patent No.: US 7,193,499 B2
(45) Date of Patent: Mar. 20, 2007

(54) CHIP RESISTOR AND METHOD OF MAKING THE SAME

(75) Inventor: Torayuki Tsukada, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 112 days.

(21) Appl. No.: 10/833,940

(22) Filed: Apr. 27, 2004

(65) Prior Publication Data

US 2004/0252009 A1 Dec. 16, 2004

(30) Foreign Application Priority Data

Apr. 28, 2003 (JP) ............................. 2003-123656

(51) Int. Cl.
*H01C 1/012* (2006.01)
(52) U.S. Cl. ...................... 338/309; 338/332
(58) Field of Classification Search ................ 338/203, 338/204, 306–309, 312, 331–332, 313, 22 R; 29/610
See application file for complete search history.

(56) References Cited

U.S. PATENT DOCUMENTS 5,907,274 A * 5/1999 Kimura et al. .............. 338/309
6,081,181 A * 6/2000 Kawase et al. ........... 338/22 R
6,124,769 A * 9/2000 Igarashi et al. ............. 333/172
6,314,637 B1 * 11/2001 Kimura et al. .............. 338/308
2006/0055505 A1 * 3/2006 Harada et al. .............. 338/308

FOREIGN PATENT DOCUMENTS

JP 2002-57009 2/2002

* cited by examiner

*Primary Examiner*—Tu Hoang
(74) *Attorney, Agent, or Firm*—Hamre, Schumann, Mueller & Larson, P.C.

(57) ABSTRACT

A chip resistor includes a resistor element in the form of a chip, and at least two electrodes formed on the resistor element. The resistor element includes an upper surface, a lower surface, and two end surfaces extending between the upper and the lower surfaces and spaced from each other. The two electrodes are provided on the lower surface of the resistor element. Each of the end surfaces of the resistor element is formed with a conductor film integrally connected to a corresponding one of the electrodes. The conductor film is made of copper, for example, and is higher in solder-wettability than the resistor element.

7 Claims, 14 Drawing Sheets

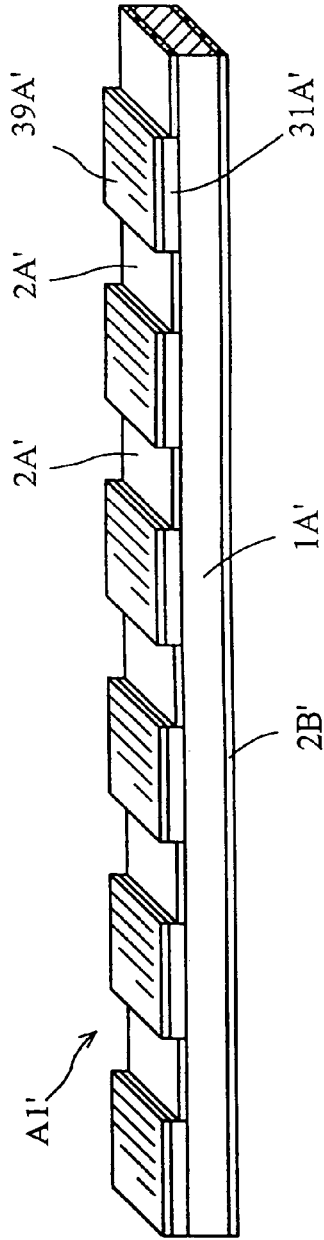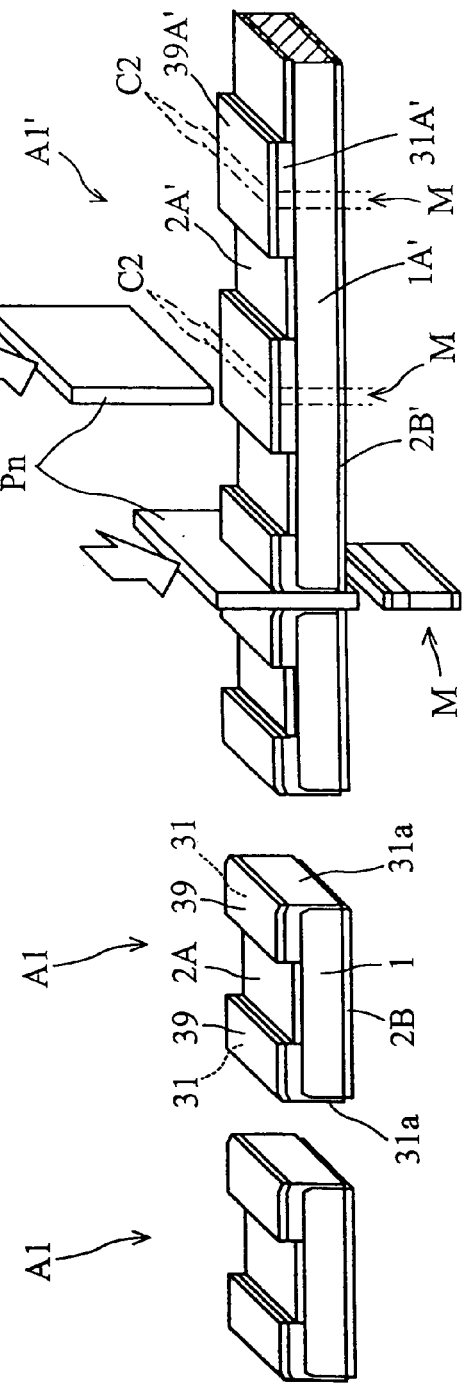

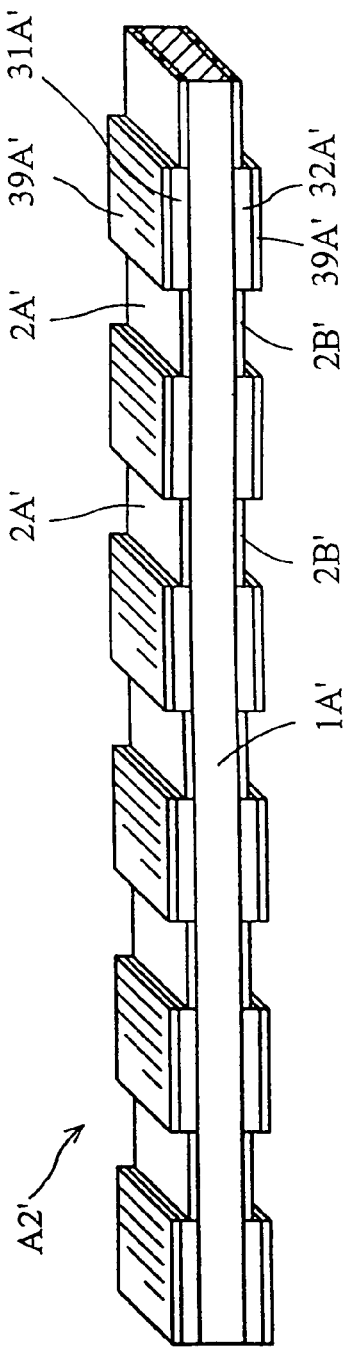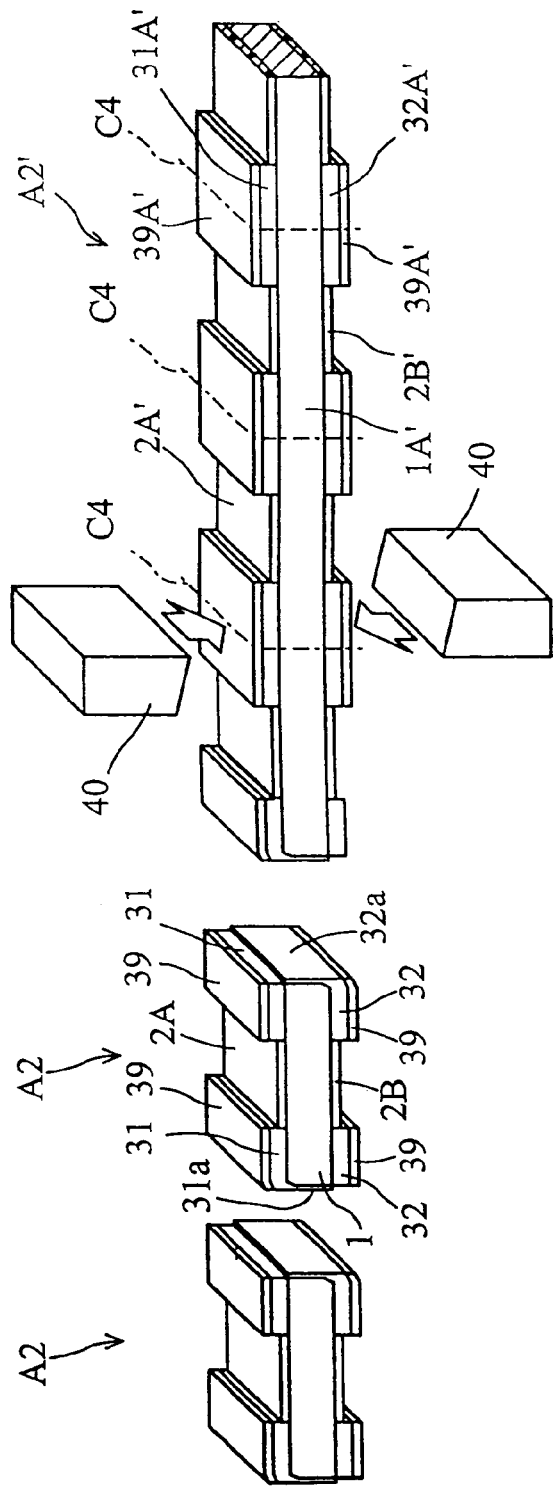

CHIP RESISTOR AND METHOD OF MAKING THE SAME

BACKGROUND OF THE INVENTION

1. Field of the Invention

The present invention relates to a chip resistor and method of making the same.

2. Description of the Related Art

An example of prior art chip resistor is shown in FIG. 14 of the present application (See JP-A-2002-57009). The illustrated chip resistor R1 includes a resistor element 90 in the form of a chip made of metal, and a pair of electrodes 91 provided on the lower surface 90b of the resistor element with a gap 93 defined therebetween. Each of the electrodes 91 has a lower surface formed with a solder layer 92.

The chip resistor R1 is made by a method as shown in FIG. 15. First, two metal plates 90' and 91' as materials for the resistor element 90 and the electrodes 91 are prepared (a). Subsequently, the metal plate 91' is laminated and bonded to the lower surface of the metal plate 90' (b). The metal plate 91' is then partially removed by machining to form a gap 93 (c). Thereafter, a solder layer 92' is formed on the lower surface of the metal plate 91' (d). Finally, the metal plate 90', 91' are cut (e). As a result, a desired chip resistor R1 is obtained.

Generally, a chip resistor is soldered to a printed circuit board, for example. In this case, it is preferable that part of the solder becomes a solder fillet adhering to an end surface of the resistor element of the chip resistor. Such a solder fillet serves to strongly bond the chip resistor to the circuit board and also to provide good conduction between the chip resistor and the circuit board. Further, by checking the presence or absence of the solder fillet from outside, it is possible to determine whether or not the chip resistor is properly bonded to the circuit board. Specifically, when a solder fillet is formed, the mounting of the chip resistor can be determined to be proper. When a solder fillet is not formed, it can be determined that the mounting of the chip resistor is probably improper.

In this way, a solder fillet has many advantages for a chip resistor. However, in the chip resistor R1 shown in FIG. 14, it is difficult to form a solder fillet on an end surface of the resistor element 90. This is because the resistor element 90 is made of an alloy to which solder is unlikely to adhere (which has low solder-wettability) such as Ni—Cu alloy, Cu—Mn alloy or Ni—Cr alloy.

SUMMARY OF THE INVENTION

The present invention is conceived under the circumstances described above. It is, therefore, an object of the present invention to provide a chip resistor which enables a solder fillet to be properly formed in surface-mounting. Another object of the present invention is to provide a manufacturing method which enables efficient manufacturing of such a chip resistor.

According to a first aspect of the present invention, there is provided a chip resistor which comprises a chip resistor element including a first main surface, a second main surface opposite to the first main surface, a first end surface extending between the first main surface and the second main surface, and a second end surface opposite to the first end surface; and at least two first electrodes provided on the first main surface and spaced from each other. The first end surface is formed with a first conductor film, whereas the second end surface is formed with a second conductor film. The conductor films are higher in solder-wettability than the resistor element.

With this structure, solder fillets can be properly formed on the first end surface and the second end surface of the resistor element in soldering the chip resistor onto a printed circuit board, for example.

Preferably, each of the first conductor film and the second conductor film is integrally connected to a respective one of the two first electrodes.

Such a conductor film can be formed by drawing part of the electrode. With this method, the conductor film can be formed efficiently at a low cost as compared with the formation of the conductor film by plating, for example.

Preferably, the chip resistor further comprises at least two second electrodes provided on the second main surface while being spaced from each other to be located opposite to the first electrodes via the resistor element. The first conductor film is integrally connected to a respective one of the two first electrodes, whereas the second conductor film is integrally connected to a respective one of the two second electrodes.

Preferably, the first electrodes and the second electrodes are made of the same material.

Preferably, the chip resistor further comprises a first insulating layer formed on the first main surface of the resistor element. The first insulating layer is provided between the two first electrodes.

Preferably, the first insulating layer is held in contact with the two first electrodes.

Preferably, the chip resistor further comprises a second insulating layer formed on the second main surface of the resistor element. The second insulating layer is provided between the two second electrodes.

Preferably, the chip resistor further comprises a solder layer covering the electrode and the conductor film.

According to a second aspect of the present invention, there is provided a method of making a chip resistor. The method comprises the steps of: preparing a resistor aggregate made of a resistor material and including a plurality of electrode layers formed on a main surface of the resistor aggregate, the electrode layers being spaced from each other; dividing the resistor aggregate into a plurality of chip resistors each including a resistor element having a main surface and two end surfaces, and at least two electrodes formed on the main surface; and forming a conductor film on each of the two end surfaces of the resistor element of each of the chip resistors.

Preferably, the formation of the conductor film is performed by drawing part of the electrode layer along a division surface of the resistor aggregate in dividing the resistor aggregate.

Preferably, the division of the resistor aggregate is performed by blanking or cutting.

Preferably, the formation of the electrode layers is performed by forming an insulating layer into a pattern on the main surface of the resistor aggregate by thick film printing and then metal-plating regions of the main surface which are not formed with the insulating layer.

Other features and advantages of the present invention will become clearer from the description of the preferred embodiments given below.

BRIEF DESCRIPTION OF THE DRAWINGS

FIG. 5A is a perspective view showing a resistor aggregate in the form of a bar obtained by the step of FIG. 4B.

FIG. 5B is a perspective view showing the process step to be performed subsequent to the step of FIG. 4B.

FIG. 10A is a perspective view showing a resistor aggregate in the form of a bar obtained by the step of FIG. 9B.

FIG. 10B is a perspective view showing the process step to be performed subsequent to the step of FIG. 9B.

DETAILED DESCRIPTION OF THE PREFERRED EMBODIMENTS

Preferred embodiments of the present invention will be described below in detail with reference to the accompanying drawings.

Figure 1:
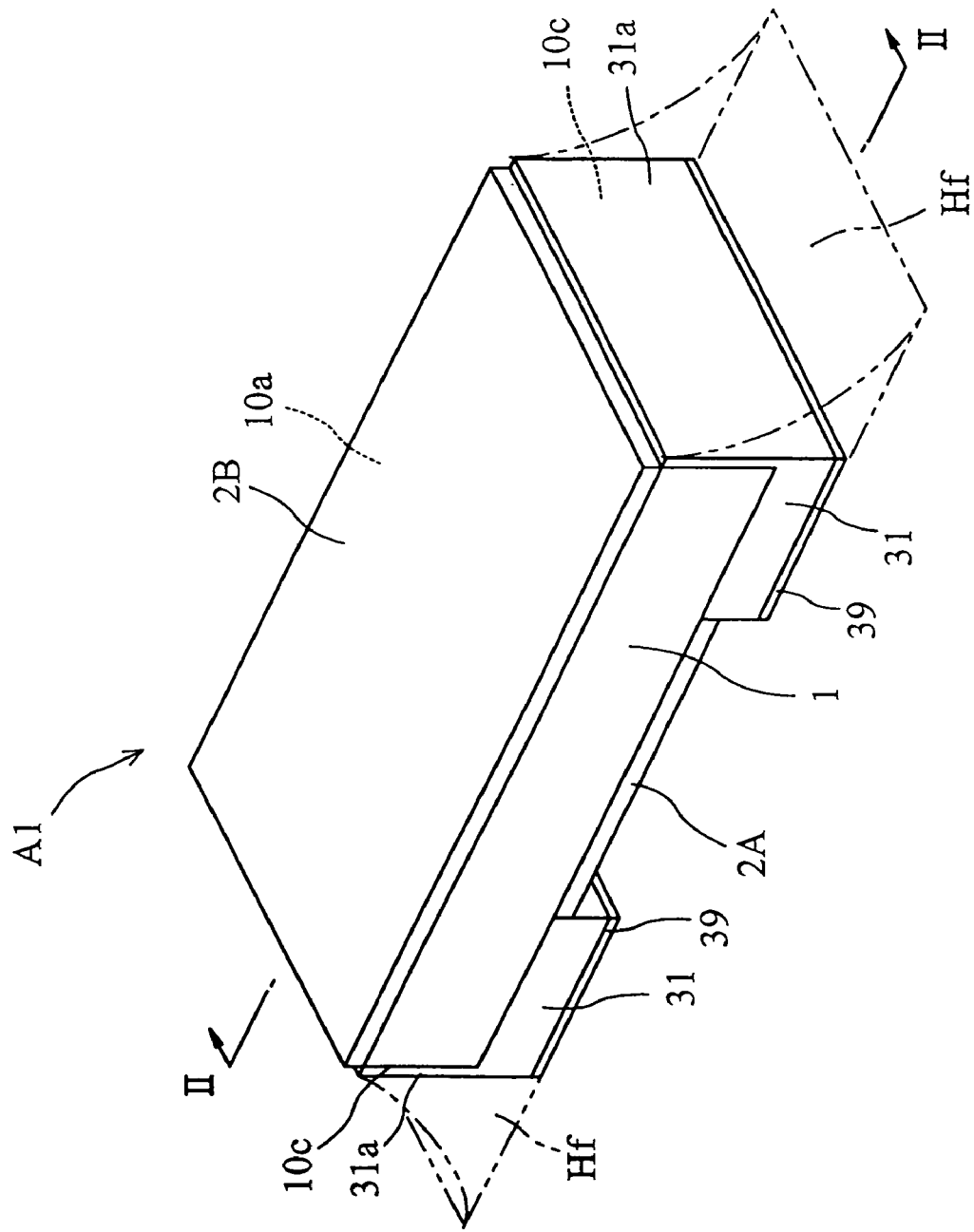
FIG. 1 is a perspective view showing a chip resistor according to a first embodiment of the present invention.
Figure 2:
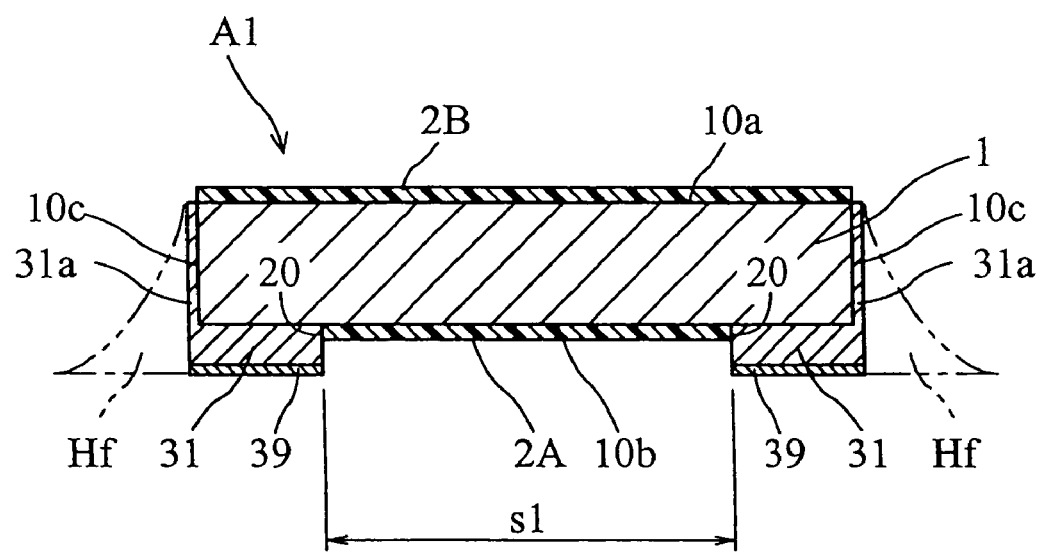
FIG. 2 is a sectional view taken along lines II—II in FIG. 1.

FIGS. 1 and 2 illustrate a chip resistor according to a first embodiment of the present invention. The illustrated chip resistor A1 includes a resistor element 1, a first insulating layer 2A, a second insulating layer 2B and a pair of electrodes 31.

The resistor element 1 is a chip having an elongated rectangular shape as viewed in plan and a uniform thickness. The resistor element 1 has an upper surface 10a, a lower surface 10b, and two end surfaces 10c extending between the upper surface and the lower surface. The end surfaces 10c are spaced from each other in the longitudinal direction of the resistor element 1. As the material of the resistor element 1, use may be made of Ni—Cu alloy, Cu—Mn alloy or Ni—Cr alloy, for example. The material of the resistor element is not limited to these, and use may be made of metal materials suitable for the size of the chip resistor A1 and having a resistivity capable of realizing the intended resistance of the chip resistor.

The first insulating layer 2A and the second insulating layer 2B may be made of epoxy resin by thick film printing, for example. The first insulating layer 2A is provided on the lower surface (first main surface) 10b of the resistor element 1. Specifically, the lower surface 10b includes regions each formed with a respective one of the paired electrodes 31 and a remaining region ("non-electrode region"). The first insulating layer 2A is so provided as to entirely cover the non-electrode region. The second insulating layer 2B is so provided as to entirely cover the upper surface (second main surface) 10a of the resistor element 1.

The paired electrodes 31 are provided on the lower surface 10b of the resistor element 1 and spaced from each other in the longitudinal direction of the resistor element 1. The electrodes 31 are made of a material (e.g. copper) having a higher solder-wettability than the resistor element 1. As will be described later, the electrodes 31 can be formed by plating the resistor element 1.

The end surfaces 10c of the resistor element 1 are each covered with a conductor film 31a. The conductor film 31a is integrally connected to a corresponding one of the electrodes 31. As will be described later, the conductor film 31a can be formed to extend upward by drawing part of the copper material constituting the electrode 31. Since copper has high malleability, drawing of copper can provide a film covering a wide region.

As shown in FIG. 2, each of the electrodes 31 has an inner end surface which is held in contact with an end surface 20 of the first insulating layer 2A. With this structure, the distance between the two electrodes 31 corresponds to the width s1 of the first insulating layer 2A. In the chip resistor A1, the resistance between the paired electrodes 31 is set to a relatively low value of about 1 to 100 m$\Omega$. Each of the electrodes 31 has a lower surface on which a solder layer 39 is laminated.

Next, a method of making the chip resistor A1 will be described with reference to FIGS. 3–5.

Figure 3A:
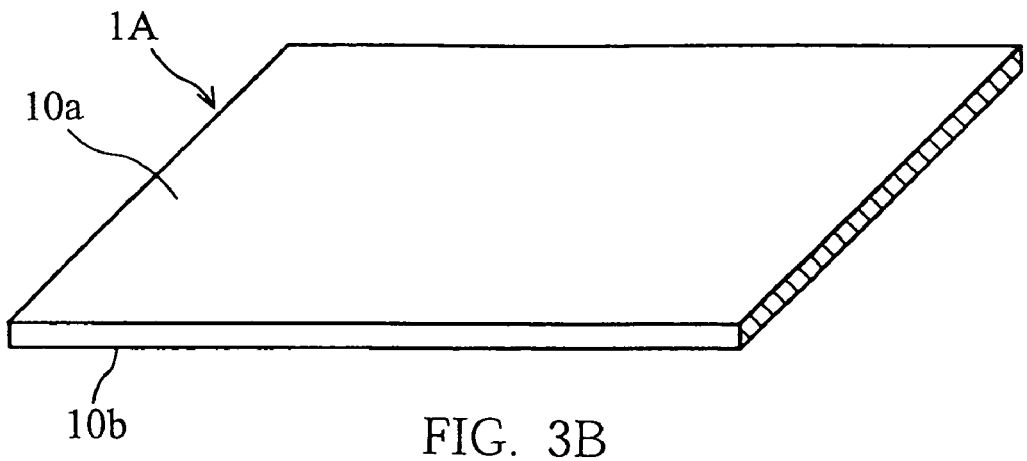
FIGS. 3A–3C are perspective views showing part of process steps for manufacturing the chip resistor of FIG. 1.

First, as shown in FIG. 3A, a metal plate (resistor material) 1A is prepared. The plate 1A has a size (length×width) capable of providing a plurality of resistor elements 1 and has a uniform thickness. The plate 1A has a first flat main surface 10a, and a second flat main surface 10b opposite to the first main surface 10a.

Figure 3B:
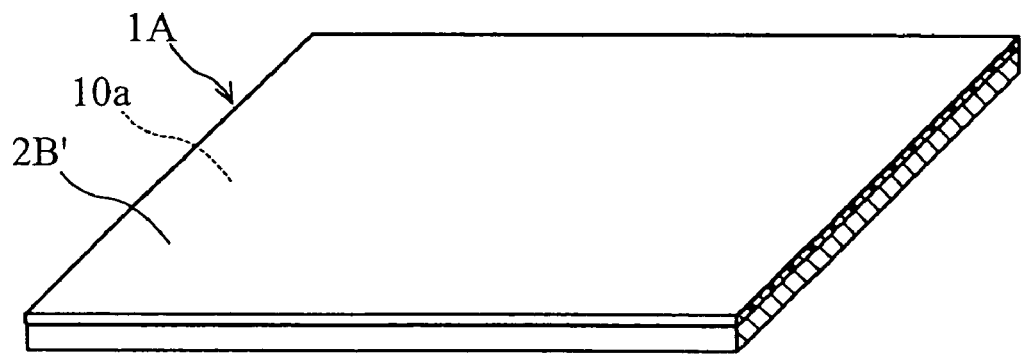

As shown in FIG. 3B, a second insulating layer 2B' is formed on the first main surface 10a of the plate 1A. The second insulating layer 2B' may be made of epoxy resin by thick film printing, for example.

Figure 3C:
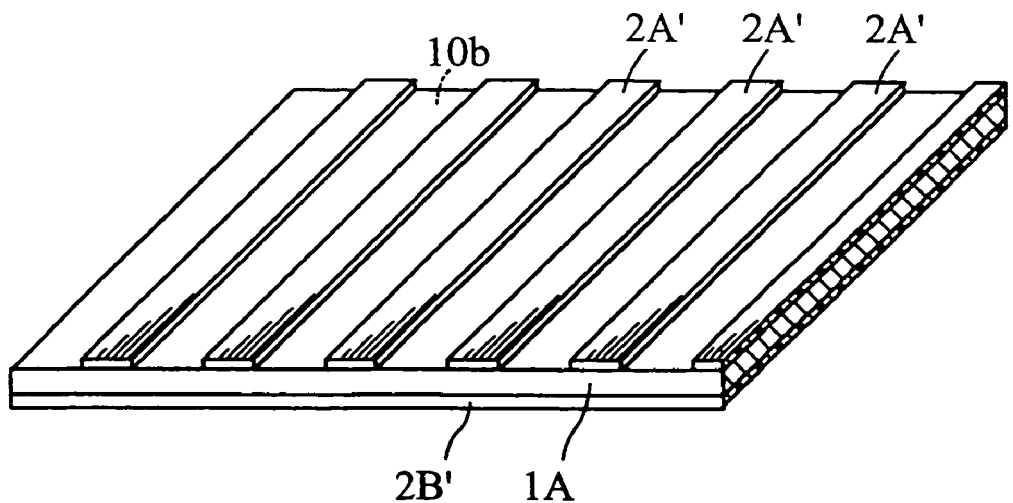

Subsequently, as shown in FIG. 3C, a plurality of first insulating layers (insulating strips) 2A' extending in parallel with each other are formed on the second main surface 10b of the plate 1A. The first insulating layers 2A' are formed by thick film printing using the same resin and the same apparatus as those used for forming the second insulating layer 2B'. By thick film printing, it is possible to form each of the first insulating layers 2A' precisely into a predetermined size (particularly width).

Figure 4A:
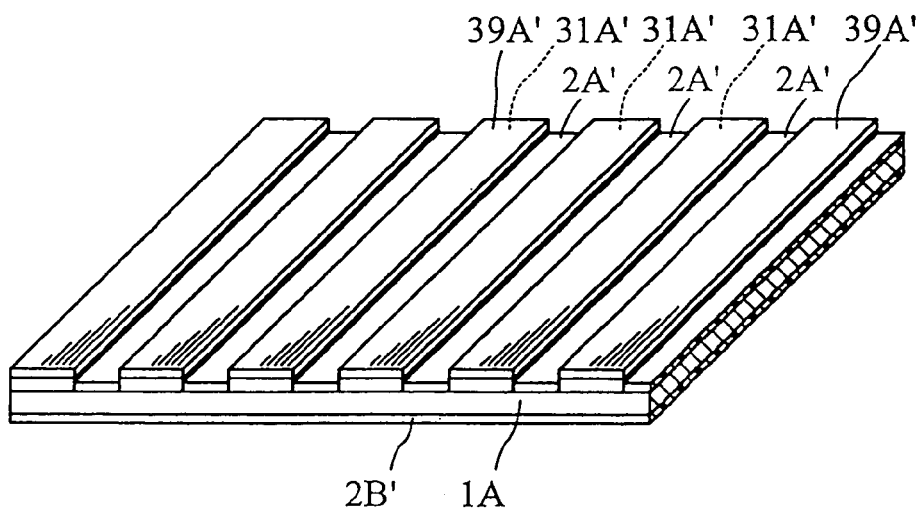
FIGS. 4A–4B are perspective views showing the process steps to be performed subsequent to the step of FIG. 3C.

As shown in FIG. 4A, conductive layers (electrode layers) 31A' and solder layers 39A' are formed on the second main surface 10b of the plate 1A at regions which are not covered with the first insulating layers 2A'. The conductive layers 31A', which are later to be formed into electrodes 31, may be formed by Cu-plating, for example. By such plating, it is possible to form the conductive layer 31A' precisely into a predetermined dimension without forming a gap between the conductive layer 31 and the first insulating layer 2A'. The solder layers 39A' may also be formed by plating, for example.

Figure 4B:
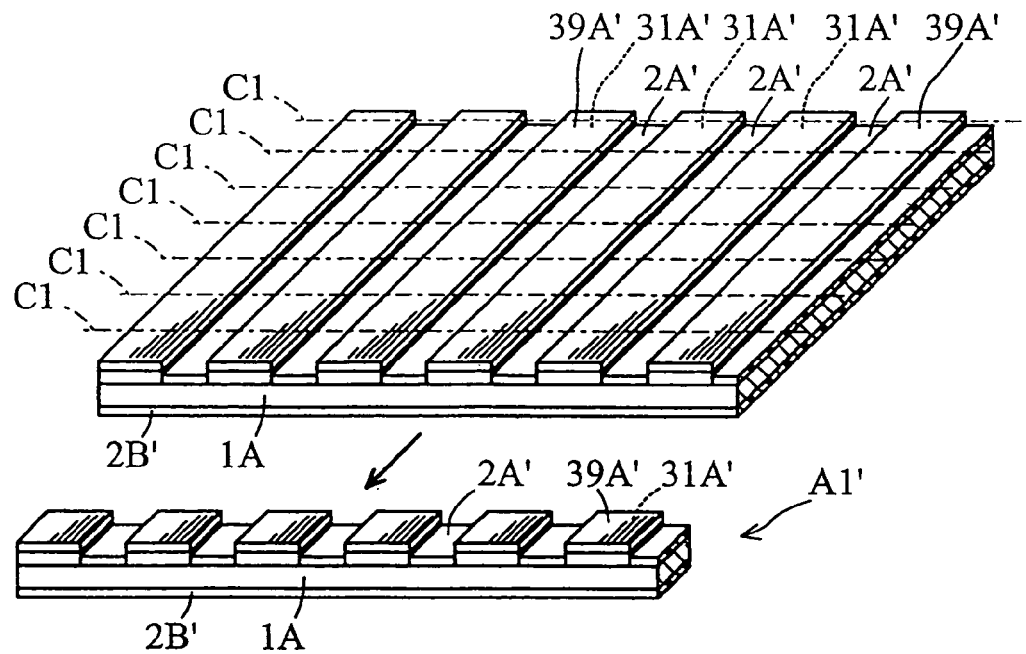

As shown in FIG. 4B, after the plating, the plate 1A of FIG. 4A is cut for division along phantom lines C1 extending perpendicularly to the direction in which the conductive layers 31A' and the first insulating layers 2A' extend. As a result, resistor aggregates A1' (See also FIG. 5A) in the form of a bar are obtained each including chip resistors A1 connected to each other in series. The pitch of the phantom lines C1 defines the width of the resistor aggregate A1' (and hence, the width of the chip resistors A1). This width corresponds to the width of the chip resistors A1 obtained by the subsequent cutting step. The cutting of the plate 1A may be performed by using a shearing machine or a rotary cutter, for example.

After the resistor aggregate A1' as shown in FIG. 5A is formed, the resistor aggregate is cut for division into a plurality of chips, as shown in FIG. 5B. The cutting operation may be performed by punching an excess portion M between phantom lines C2 downward by using a punch Pn having a flat section. By this operation, part of the resistor aggregate A1' is separated at the excess portion M as a chip resistor A1, while part of the conductive layer 31A' adjacent the excess portion M is drawn downward (along the division surface of the resistor material). Thus, conductor films 31a covering opposite end surfaces of the chip resistor A1 are provided. By repetitively performing the cutting operation using the punch Pn, a plurality of chip resistors A1 are obtained from a single resistor aggregate A1'.

Figure 6:
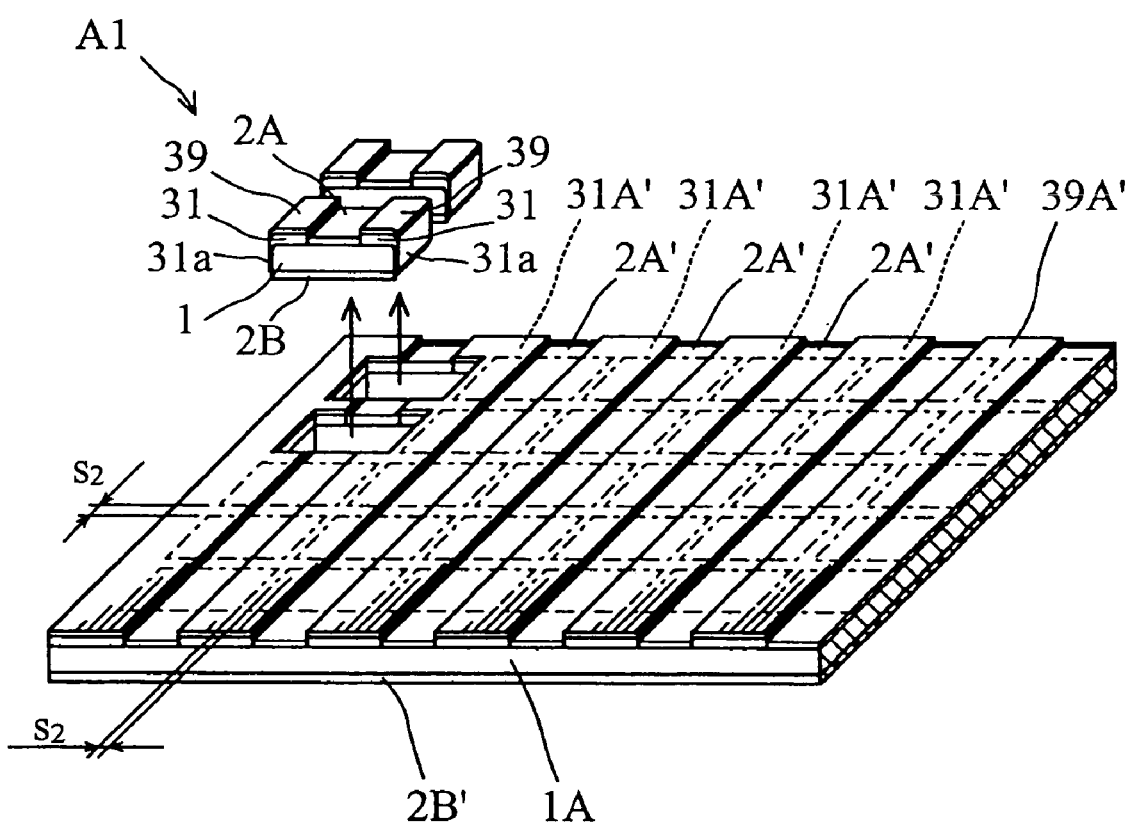
FIG. 6 is a perspective view showing an example of method for obtaining individual chip resistors from the resistor aggregate in the form of a plate shown in FIG. 4C.

FIG. 6 shows a method of making a chip resistor by blanking or die cutting. In this method, blanking is repetitively performed with respect to the plate 1A shown in FIG. 4A to die-cut the plate 1A into a plurality of resistor elements 1 in the form of a chip. In repetitively performing the blanking, a single punch is repetitively used, whereby a plurality of identical chip resistors can be obtained.

In the blanking operation, the plate 1A is so blanked that each of two adjacent conductive layers 31A' together with the relevant solder layer 39A' is divided into two parts. By such blanking, electrodes 31 and solder layers 39 are formed at opposite ends of the chip resistor element 1, whereby a chip resistor A1 is obtained. In this case again, since the conductor layers 31A' are made of copper having high malleability, part of the conductor layers 31A' is drawn downward by blanking, whereby conductor films 31a are easily formed on opposite end surfaces of the chip resistor 1. The blanking of the plate 1A is performed with respect to a plurality of blanking regions (spaced from each other by a distance $S_2$), as indicated by phantom lines in FIG. 6.

Unlike the prior art method, in both of the above-described methods, a pair of electrodes are not formed by cutting a metal plate. Therefore, the chip resistor A1 can be manufactured efficiently at a relatively low cost.

The chip resistor A1 is surface-mounted on an intended mounting object such as a circuit board by known solder reflow technique.

The conductor films 31a are made of copper and have high solder-wettability. Therefore, in surface-mounting the chip resistor, solder easily adheres also onto the conductor films 31a, whereby solder fillets Hf are properly formed, as indicated by phantom lines in FIGS. 1 and 2. Therefore, whether or not the chip resistor A1 is properly mounted can be determined by checking the presence or absence of the solder fillets Hf, and the solder bond strength of the chip resistor A1 is enhanced. Moreover, due to the presence of the solder fillets Hf, the heat generated when the chip resistor A1 is energized can be transferred to the circuit board through the solder fillets Hf, whereby the temperature increase of the chip resistor A1 can be suppressed.

In the chip resistor A1, the non-electrode region at the lower surface 10b of the resistor element 1 is covered with the first insulating layer 2A. Therefore, in surface-mounting the chip resistor A1, molten solder does not adhere to the lower surface 10b of the resistor element 1.

In the chip resistor A1, the dimension s1 between the paired electrodes 31 is determined in forming the insulating layer 2A into a pattern by thick film printing. In the thick film printing, the dimension of the insulating layer 2A can be set precisely. Therefore, the resistance of the chip resistor A1 can be easily set to an intended value.

Figure 7:
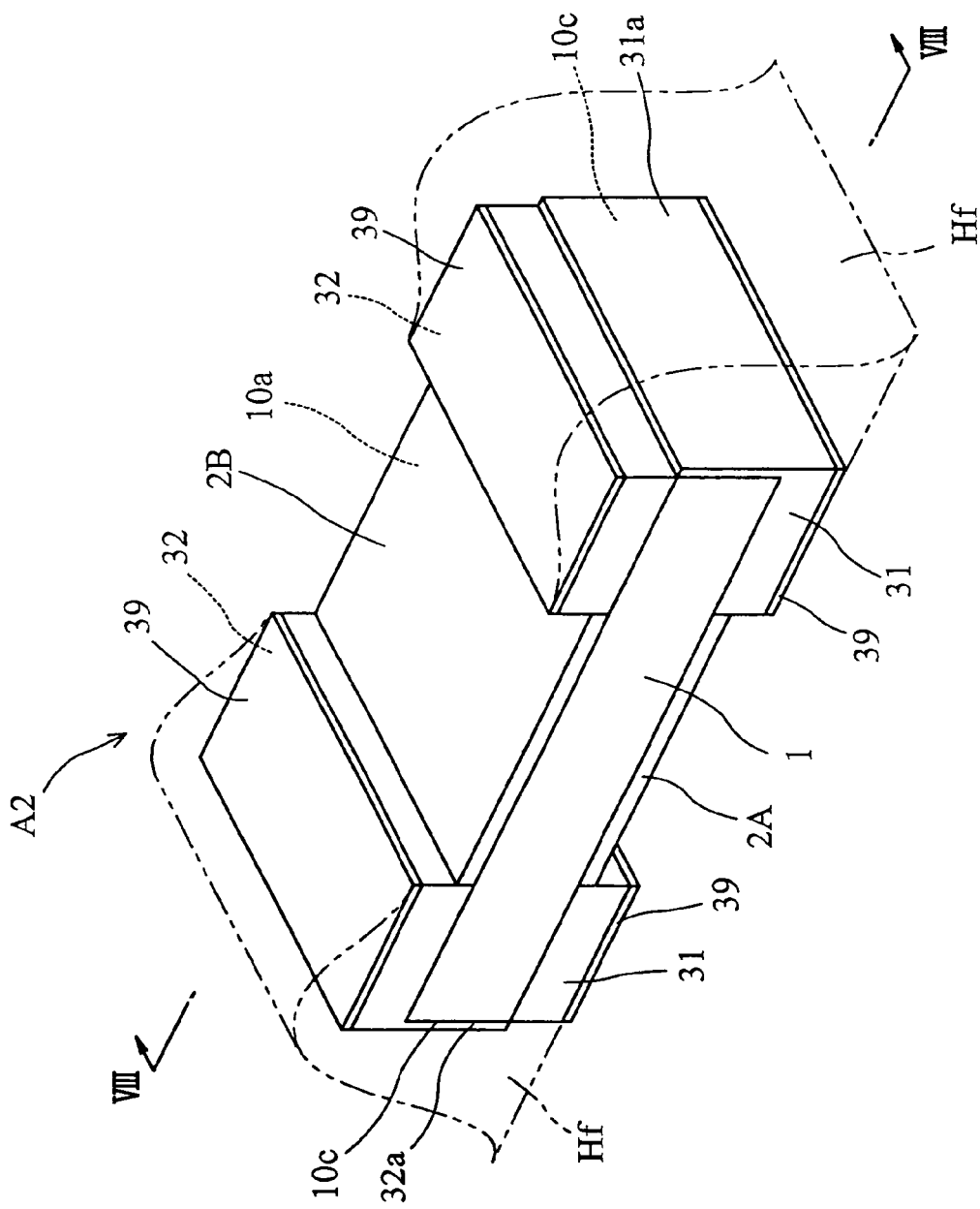
FIG. 7 is a perspective view showing a chip resistor according to a second embodiment of the present invention.
Figure 8:
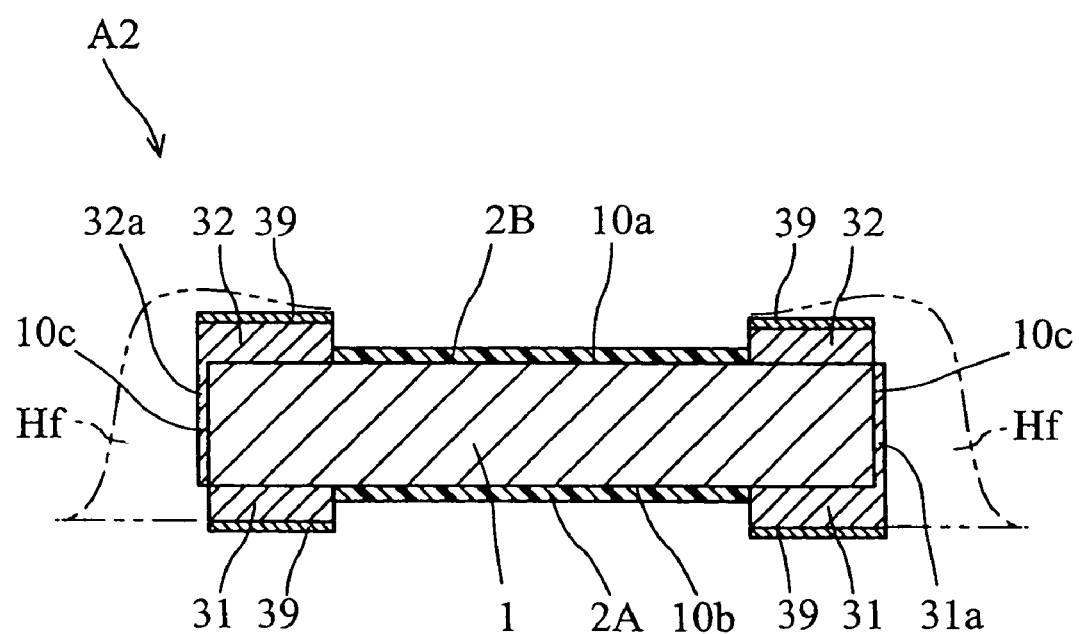
FIG. 8 is a sectional view taken along lines VIII—VIII in FIG. 7.

FIGS. 7 and 8 illustrate a chip resistor according to a second embodiment of the present invention. In these and the subsequent figures, the elements which are identical or similar to those of the first embodiment are designated by the same reference signs as those used for the first embodiment.

In addition to the electrodes (first electrodes) 31 formed on the lower surface 10b of the resistor element 1, the chip resistor A2 of the second embodiment includes a pair of second electrodes 32 spaced from each other on the upper surface 10a of the resistor element 1. As shown in FIG. 8, the second electrodes 32 face the first electrodes 31 via the resistor element 1.

The chip resistor A2 has longitudinally opposite end surfaces, i.e., an end surface 10c (right end surface in FIG. 8) formed with a conductor film 31a and the other end surface 10c (left end surface in FIG. 8) formed with a conductor film 32a. The conductor film 31a is integrally connected to the first electrode 31 of the right side, whereas the conductor film 32a is integrally connected to the second electrode 32 of the left side. As will be described later, the conductor films 31a, 32a are formed by drawing part of the copper material constituting the first electrode 31 or the second electrode 32.

According to this chip resistor A2, solder fillets Hf can be formed on the paired second electrodes 32 as well as on the conductor films 31a, 32a. Therefore, as indicated by phantom lines in FIGS. 7 and 8, the solder fillets Hf cover the longitudinally opposite ends of the chip resistor A2, whereby the solder bond strength is enhanced. This arrangement is also advantageous to suppress the temperature increase of the chip resistor in energizing the chip resistor.

Next, a method of making the chip resistor A2 will be described with reference to FIGS. 9 and 10.

Figure 9A:
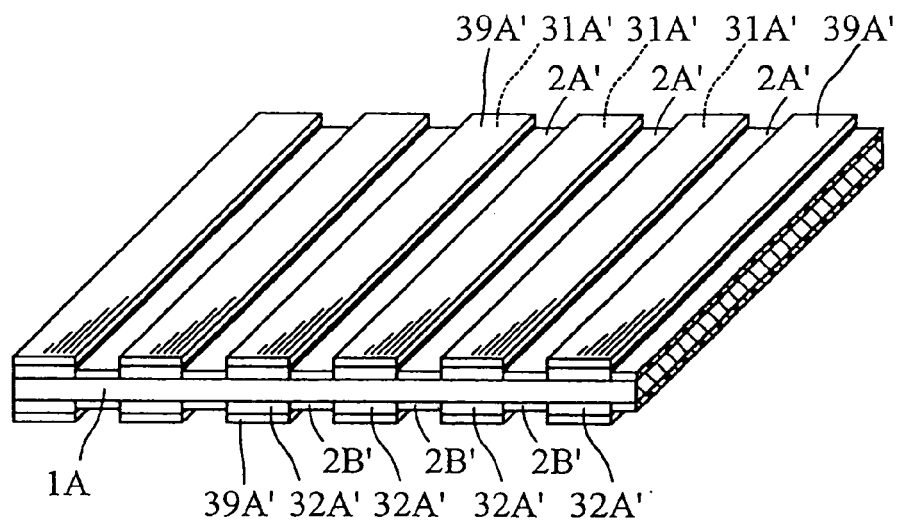
FIGS. 9A–9B are perspective views showing part of process steps for manufacturing the chip resistor of FIG. 7.
Figure 9B:
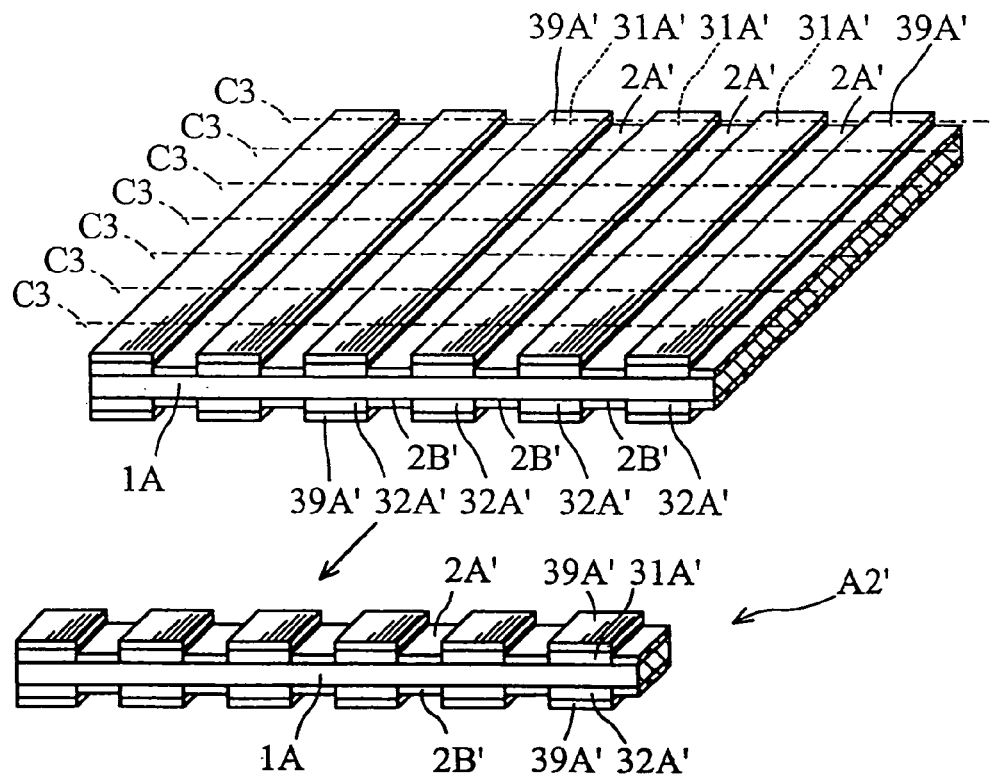

First, as shown in FIG. 9A, an intermediate product for resistor aggregates is prepared. Similarly to the method of making the chip resistor A1, the intermediate product for resistor aggregates is prepared by forming first and second insulating layers 2A', 2B' on opposite surfaces of a plate 1A into predetermined patterns and then forming first and second conductive layers 31A', 32A' and solder layers 39A' by plating. Subsequently, as shown in FIG. 9B, the intermediate product is cut along phantom lines C3 to provide resistor aggregates A2' (shown in FIG. 10A as enlarged).

After the resistor aggregate A2' is formed, the resistor aggregate is cut for division into a plurality of chips, as shown in FIG. 10B. Specifically, the resistor aggregate is cut along phantom lines C4 in the figure by using a shearing machine 40, for example. In cutting, part of the first conductive layer 31A' located on the right side of the phantom line C4 is drawn downward to form a conductor film 31a on the left end surface of a chip resistor A2. Further, part of the second conductive layer 32A' located on the left side of the phantom line C4 is drawn upward to form a conductor film 32a on the right end surface of a chip resistor A2. By repetitively performing such cutting operation, chip resistors A4 each provided with conductor films 31a and 32a are provided.

In the above embodiment, the conductor films 31a, 32a are formed by respectively utilizing first and second electrodes 31, 32 formed on upper and lower surfaces of the chip resistor A2. With this method, conductor films are formed on both sides of the cut surface by a single cutting operation using the shearing machine 40. Therefore, as compared with the cutting operation using a punch, excess portions for cutting need not be provided, whereby the plate 1 can be utilized more efficiently.

Figure 11:
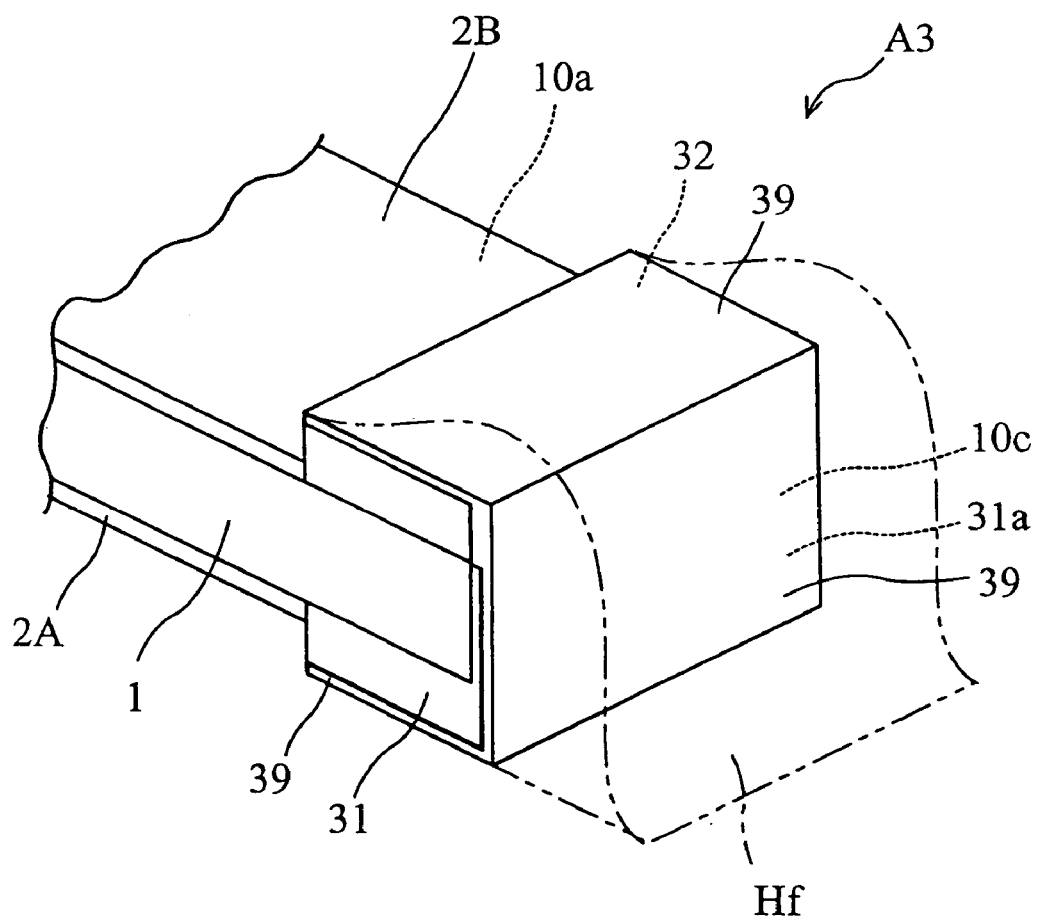
FIG. 11 is a perspective view illustrating a chip resistor according to a third embodiment of the present invention.

FIG. 11 shows a chip resistor according to a third embodiment of the present invention. Each end of the chip resistor A3 shown in the figure includes a solder layer 39 covering surfaces of a first electrode 31, a second electrode 32 and a conductor film 31a. With this structure, a solder fillet Hf can be easily formed on these surfaces.

Figure 12:
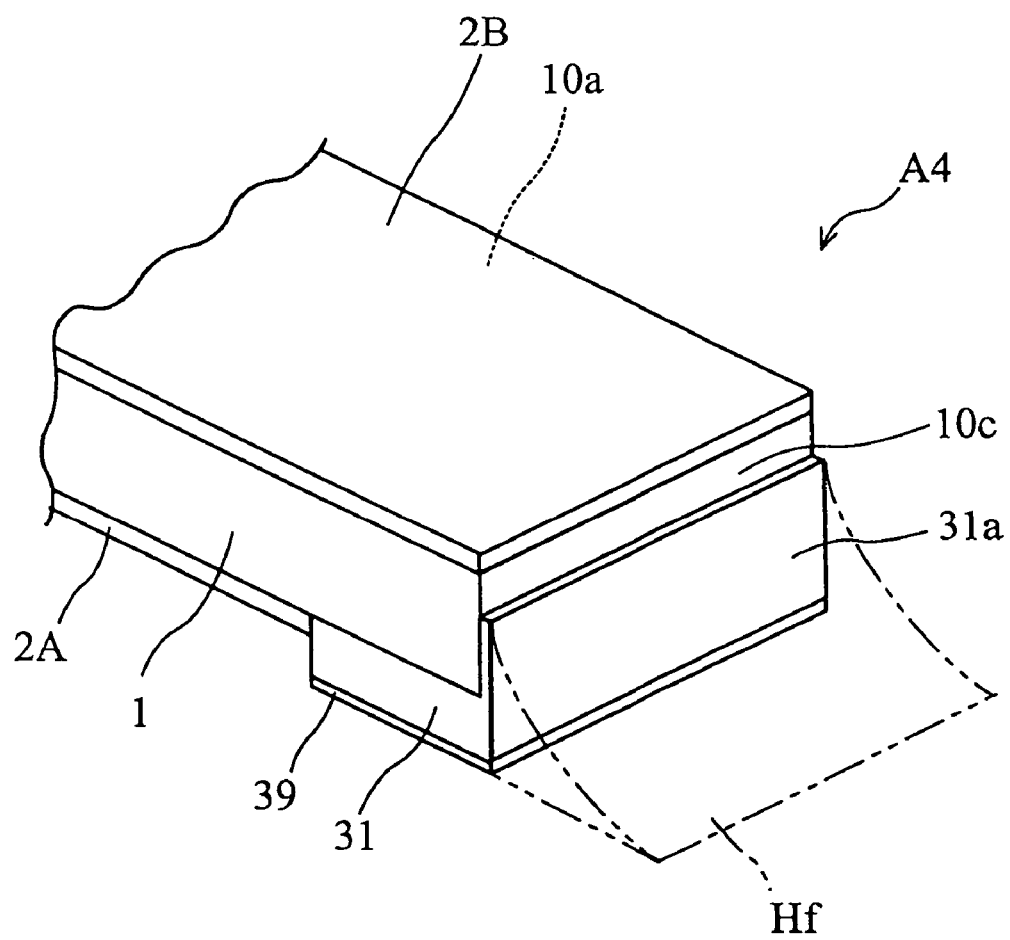
FIG. 12 is a perspective view illustrating a chip resistor according to a fourth embodiment of the present invention.

FIG. 12 shows a chip resistor according to a fourth embodiment of the present invention. Each end of the chip resistor A4 shown in the figure includes a conductor film 31a covering an end surface 10c of the resistor element 1 only partially, not entirely. With this structure again, a solder fillet Hf can be formed on the end surface 10c of the resistor element 1.

Figure 13:
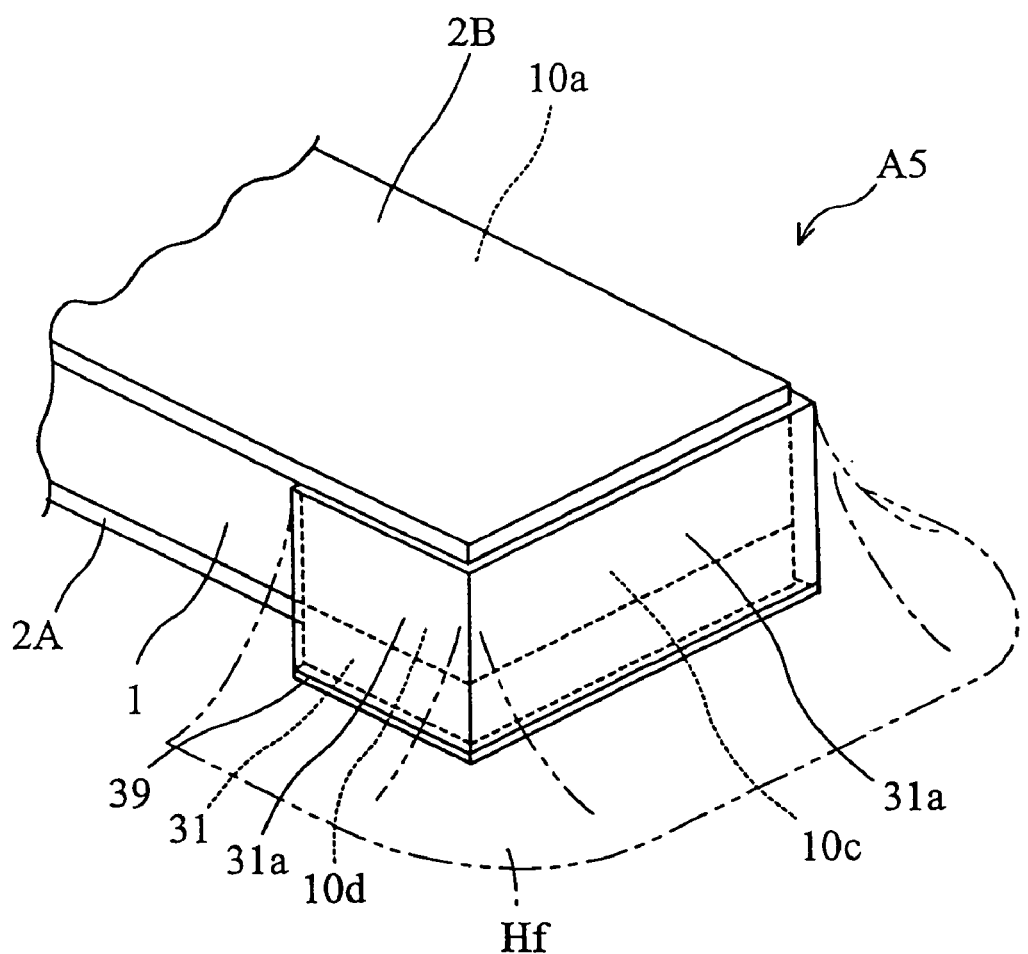
FIG. 13 is a perspective view illustrating a chip resistor according to a fifth embodiment of the present invention.
Figure 14:
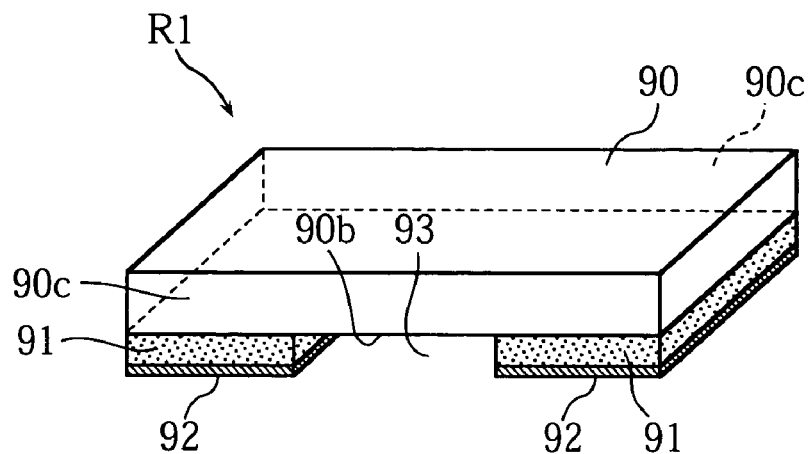
FIG. 14 is a perspective showing a prior art chip resistor.
Figure 15:
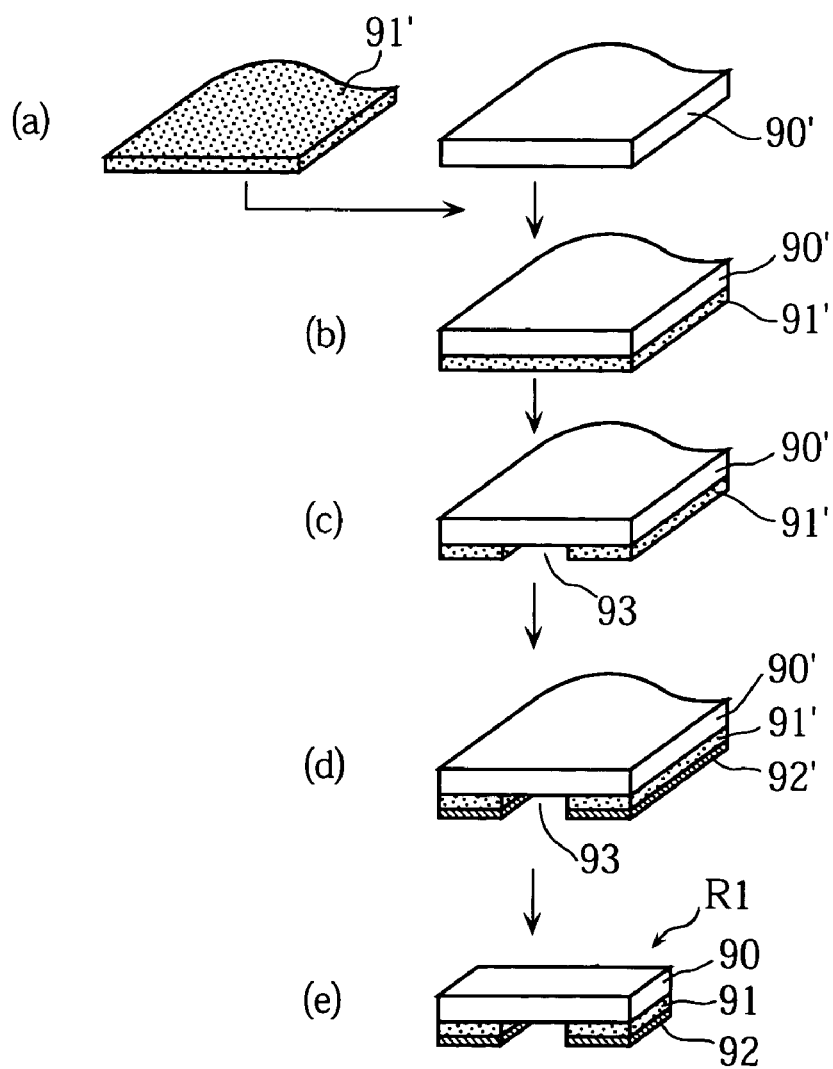
FIG. 15 shows a method of making the prior art chip resistor.

FIG. 13 shows a chip resistor according to a fifth embodiment of the present invention. Each end of the chip resistor A5 shown in the figure includes a conductor film 31a covering an end surface 10c and part of paired side surfaces 10d of the resistor element 1. With this structure, it is possible to form a solder fillet Hf spreading in three directions from the chip resistor A5, as indicated by phantom lines in the figure.

Although the conductor film is formed by drawing part of an electrode in each of the foregoing embodiments, the present invention is not limited thereto. For instance, the conductor film may be formed by plating or by making a film of a material having high solder-wettability and then bonding the film to the resistor element. To enhance the productivity, it is preferable to make the conductor film from the same material as that of the electrodes. However, the conductor film may be made of a material different from that of the electrodes as long as the material of the conductor film is higher in solder-wettability than the resistor element.

According to the present invention, one chip resistor may be provided with no less than two pairs of electrodes. When such a large number of electrodes are provided, only part of the electrodes may be used, for example.

In the above-described manufacturing methods, a resistor material in the form of a plate is first prepared for division into a plurality of chip resistors. However, the present invention is not limited thereto. For instance, instead of using a plate-like resistor material, a resistor material in the form of a bar may be used from the first.

The present invention being thus described, it is apparent that the same may be varied in many ways. Such variations should not be regarded as a departure from the spirit and scope of the present invention, and all such modifications as would be obvious to those skilled in the art are intended to be included within the scope of the following claims.

The invention claimed is:

1. A chip resistor comprising:
   a chip resistor element including a first main surface, a second main surface opposite to the first main surface, a first end surface extending between the first main surface and the second main surface, and a second end surface opposite to the first end surface; and
   at least two first electrodes used for surface-mounting, the two first electrodes being provided on the first main surface and spaced from each other;
   wherein the first end surface is formed with a first conductor film that is held in direct contact with the first end surface and exposed to an exterior, whereas the second end surface is formed with a second conductor film that is held in direct contact with the second end surface and exposed to the exterior, the conductor films being higher in solder-wettability than the resistor element.

2. The chip resistor according to claim 1, wherein each of the first conductor film and the second conductor film is integrally connected to a respective one of the two first electrodes.

3. The chip resistor according to claim 1, further comprising at least two second electrodes provided on the second main surface and spaced from each other to be located opposite to the first electrodes via the resistor element, wherein the first conductor film is integrally connected to a respective one of the two first electrodes, whereas the second conductor film is integrally connected to a respective one of the two second electrodes.

4. The chip resistor according to claim 3, wherein the first electrodes and the second electrodes are made of a same material.

5. The chip resistor according to claim 1, further comprising a first insulating layer formed on the first main surface of the resistor element, the first insulating layer being provided between the two first electrodes.

6. The chip resistor according to claim 5, wherein the first insulating layer is held in contact with the two first electrodes.

7. The chip resistor according to claim 3, further comprising a second insulating layer formed on the second main surface of the resistor element, the second insulating layer being provided between the two second electrodes.

* * * * *